United States Patent [19] … [11] 4,270,960
Bollen et al. … [45] Jun. 2, 1981

[54] METHOD OF MANUFACTURING A SEMICONDUCTOR DEVICE UTILIZING A MONO-POLYCRYSTALLINE DEPOSITION ON A PREDEPOSITED AMORPHOUS LAYER

[75] Inventors: Lambertus J. M. Bollen; Jan Goorissen, both of Eindhoven, Netherlands

[73] Assignee: U.S. Philips Corporation, New York, N.Y.

[21] Appl. No.: 81,754

[22] Filed: Oct. 3, 1979

[30] Foreign Application Priority Data

Oct. 23, 1978 [NL] Netherlands ............... 7810549

[51] Int. Cl.$^3$ ............... H01L 21/205; H01L 21/441
[52] U.S. Cl. ............... 148/175; 29/576 E; 29/591; 148/174; 357/59; 357/65; 357/71
[58] Field of Search ............... 148/174, 175; 427/86, 427/93; 29/576 G, 591; 357/59, 65, 71

[56] References Cited

U.S. PATENT DOCUMENTS

| 3,600,651 | 8/1971 | Duncan | 357/59 |
| 3,698,947 | 10/1972 | Kemlage et al. | 148/174 X |
| 3,771,026 | 11/1973 | Asai et al. | 357/59 X |
| 3,930,067 | 12/1975 | Gorrissen | 427/86 |
| 3,978,515 | 8/1976 | Evans et al. | 357/59 X |
| 4,087,571 | 5/1978 | Kamins et al. | 427/86 |
| 4,151,006 | 4/1979 | De Graaff et al. | 357/59 X |

OTHER PUBLICATIONS

Chaudhari et al., "Growing Crack-Free Single-Crystal Films," I.B.M. Tech. Discl. Bull., vol. 15, No. 9, Feb. 1973, p. 2700.
Chaudhari et al., "Annealing to Fill Cracks in Thin Films," Ibid., vol. 15, No. 9, Feb. 1973, p. 2697.

Primary Examiner—R. Dean
Assistant Examiner—W. G. Saba
Attorney, Agent, or Firm—Thomas A. Briody; Robert T. Mayer; Paul R. Miller

[57] ABSTRACT

A method of manufacturing a semiconductor device is provided in which a masking layer is formed on a part of a surface of a monocrystalline semiconductor body and the semiconductor body is then subjected at the side of the surface to an epitaxial treatment from a gaseous phase, and an epitaxial layer is deposited of which a portion on the uncovered part of the surface is monocrystalline and a portion on the masking layer is polycrystalline. This method is characterized in that, prior to the epitaxial treatment, an amorphous or polycrystalline layer is deposited both on the masking layer and on the uncovered part of the surface at a temperature which is lower than that at which the epitaxial layer is deposited. In this layer the layer portion on the uncovered surface part changes into the monocrystalline state by a thermal treatment preceding the deposition of the epitaxial layer.

9 Claims, 1 Drawing Figure

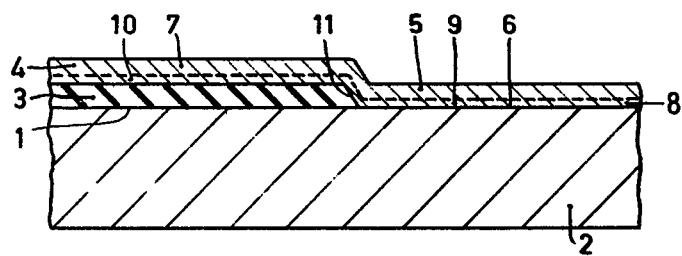

METHOD OF MANUFACTURING A SEMICONDUCTOR DEVICE UTILIZING A MONO-POLYCRYSTALLINE DEPOSITION ON A PREDEPOSITED AMORPHOUS LAYER

The invention relates to a method of manufacturing a semiconductor device in which a masking layer is formed on a part of a surface of a monocrystalline semiconductor body and the semiconductor body is then subjected on the side of the surface to an epitaxial treatment from a gaseous phase, wherein a monocrystalline expitaxial layer is deposited on the uncovered part of the surface and a polycrystalline epitaxial portion is provided on the masking layer, and to a semiconductor device manufactured by means of the method.

The polycrystalline part may fulfil a useful function in semiconductor devices, for example, as insulation or as a conductor for contacting active regions of the device (see, for example, Netherlands Patent Application No, 7,107,039, IEEE J. Sol St. Circ. Vol. SC-12,367–375 (1977) and U.S. Pat. No. 3,600,651).

However, it proves to be substantially impossible to form an epitaxial layer where the mmonocrystalline and polycrystalline parts readily adjoin each other, and as a result interruptions are formed in the layer which prevent a good operation of the device.

In the case where a silicon layer is deposited in the epitaxial treatment and the masking layer consists of silicon dioxide, the lack of continuity between polycrystalline and monocrystalline parts of the layer, for example, may be caused by nucleation problems and parasitic chemical etching reactions in which silicon and silicon dioxide, react to the volatile silicon monoxide at temperatures of, for example, 1050° C. which are usual in the epitaxial treatment.

One of the objects of the invention is to avoid the problems of the known method at least to a considerable extent.

The invention is inter alia based on recognition that an improvement can be obtained by depositing a layer on the surface having a good step covering.

According to the invention, therefore, the method mentioned in the opening paragraph is characterized in that, prior to the epitaxial treatment, an amorphous or polycrystalline layer is deposited both on the masking layer and on the uncovered part of the surface at a temperature lower than that at which the epitaxial layer is deposited. In this layer the layer portion on the uncovered surface part changes into the monocrystalline state by a thermal treatment preceding deposition of the epitaxial layer.

The amorphous or polycrystalline layer provides a good step covering. It is maintained during the thermal treatment in which the layer portion on the masking layer recrystallizes but remains polycrystalline, albeit with coarser grain structure.

Good step cover is also maintained during deposition of the epitaxial layer.

The thermal treatment may simply be that treatment which is used when the semiconductor body is heated at the temperature for depositing the epitaxial layer.

It may also be necessary to use a longer thermal treatment, depending on the thickness of the amorphous or polycrystalline layer used.

The amorphous or polycrystalline layer is also deposited at temperatures which are lower than those which are usual in epitaxial treatments because the surface mobility of the atoms must be so small that polycrystalline or amorphous material is also deposited on the uncovered surface part.

When a sub-atmospheric pressure is used, at preferably 0.01–10 Torr, for depositing the amorphous or polycrystalline layer, maximum uniformity and step covering is obtained. This is associated inter alia with the fact that diffusion of reactants occurs at low pressure more rapidly than surface reactions and hence these surface reactions become more decisive of the growth rate of the layer.

A masking layer of silicon dioxide is preferably formed on a semiconductor body of silicon and an amorphous or polycrystalline layer of silicon is deposited at a temperature which is lower than 800° C.

No noticeable reaction occurs between silicon and silicon dioxide.

An amorphous or polycrystalline layer is preferably deposited in a thickness which is smaller than 1000 Å and which is at least 20 Å, preferably approximately 200 Å.

Layers having such a thickness are converted onto a monocrystalline form in the subsequent epitaxial treatment, in as far as they are present on the uncovered part of the surface, a good continuity between the monocrystalline and polycrystalline parts of the layer is obtained.

The invention will now be described in greater detail with reference to the accompanying drawing and an example.

The FIGURE is a diagrammatic sectional view of a part of a semiconductor device in a stage of manufacture by means of the method according to the invention.

In the example, a masking layer 3 is formed on a part of a surface 1 of a monocrystalline semiconductor body 2. The semiconductor body 2 is then subjected to a gaseous phase epitaxial treatment on the side of the surface 1.

An epitaxial layer 4 is deposited of which a portion 5 on the uncovered part 6 of the surface is monocrystalline and a portion 7 on the masking layer 3 is polycrystalline.

According to the invention, prior to the epitaxial treatment, an amorphous or polycrystalline layer 8 is deposited both on the masking layer 3 and on the said uncovered part 6 of the surface at a temperature lower than that at which the epitaxial layer 4 is deposited. The upper limit of layer 8 is denoted by a broken line.

The layer portion 9 of the layer 8 on the uncovered surface part 6 changes into a monocrystalline state by a thermal treatment preceding the deposition of the epitaxial layer 4.

The layer portion 10 of the layer 8 on the masking layer 3 also recrystallizes but becomes or remains polycrystalline.

Upon provision, the layer 8 provides a homogeneous covering of the masking layer 3, the uncovered surface part 6 and the step 11 which is the boundary of the masking layer 3. This good step covering is maintained during the thermal treatment and the associated recrystallisation of the layer 8.

Starting material is, for example, a disk-shaped silicon semiconductor body 2 having a diameter of 5 cm on which a 0.5 μm thick masking layer 3 of silicon dioxide is formed in a usual manner.

A 200 Å thick amorphous or polycrystalline layer 8 is deposited on the masking layer 3 and the surface part 6 in approximately 2 minutes. A gas flow is used which consists of silane, the temperature of the silicon body is approximately 625° C., hence considerably lower than the temperatures which are usual and ordinary during epitaxy of silicon, and the pressure used is 0.5 Torr.

For the thermal treatment in which the layer 8 is to be recrystallized, the normally used heating to the epitaxial deposition temperature is sufficient. It is 5 minutes.

A 0.5 μm thick epitaxial silicon layer 4 is deposited in 1 minute on the recrystallized layer 8 starting from a gas flow containing 0.1% by volume of silane in hydrogen as a carrier gas at atmospheric pressure and a temperature of the silicon body of 1050° C.

The epitaxial layer also shows a good step covering and a homogeneous thickness throughout the disk.

With a thickness of the amorphous or polycrystalline layer below 20 Å the layer thickness is often not homogeneous and the step covering may also be less good. It is to be observed that according to whether the temperature at which the amorphous or polycrystalline layer is deposited is lower, the thickness of the layer may be chosen to be smaller.

With a thickness of the layer above 1000 Å the time required to convert the amorphous or polycrystalline layer on the surface part not coated by the masking layer into the monocrystalline form is unacceptably long.

The invention is not restricted to the example described, it will be obvious that many possibilities are available for realization to those skilled in the art without departing from the scope of this invention.

For example, the masking layer may be made from materials other than silicon dioxide, for example silicon nitride.

Besides by the method described, the amorphous or polycrystalline layer may alternatively be provided by other techniques of coating, for example, sputtering or vapour deposition.

Prior to and succeeding the above-described treatments, the usual treatments are carried out, for example, diffusion and contacting, so that the semiconductor disk is converted into the desired semiconductor devices.

What is claimed is:

1. A method of manufacturing a semiconductor device comprising the steps of forming a masking layer on a part of a surface of a monocrystalline semiconductor body, and subjecting said surface to a gaseous phase epitaxial treatment so that an epitaxial layer is deposited on said surface, said epitaxial layer on uncovered portions of said surface being monocrystalline and said epitaxial layer on said masking layer being polycrystalline, characterized in that prior to said epitaxial treatment, an amorphous or polycrystalline layer is deposited both on said masking layer and on said uncovered portions of said surface at a temperature lower than that at which said epitaxial layer is deposited, said amorphous or polycrystalline layer portion on said uncovered portions of said surface changing into a monocrystalline state upon thermal treatment preceding said step of epitaxial treatment.

2. A method as claimed in claim 1, characterized in that a subatmospheric pressure of 0.01-10 Torr is used for deposition of said amorphous or polycrystalline layer.

3. A method as claimed in claim 1 or 2 characterized in that a masking layer of silicon dioxide is formed on said semiconductor body, said semiconductor body is silicon, and an amorphous or polycrystalline layer of silicon is deposited at a temperature lower than 800° C.

4. A method as claimed in claim 3, characterized in that said amorphous or polycrystalline layer is deposited at a thickness smaller than 1000 A.

5. A method as claimed in claim 4, characterized in that said amorphous or polycrystalline layer is deposited at a thickness of at least 20 A.

6. A method as claimed in claim 5, characterized in that said amorphous or polycrystalline layer is deposited at a thickness of approximately 200 A.

7. A method as claimed in claim 1, characterized in that said amorphous or polycrystalline layer is deposited at a thickness smaller than 1000 A.

8. A method as claimed in claim 7, characterized in that said amorphous or polycrystalline layer is deposited at a thickness of at least 20 A.

9. A method as claimed in claim 8, characterized in that said amorphous or polycrystalline layer is deposited at a thickness of approximately 200 A.

* * * * *